United States Patent [19]
Rabinovitz

[11] Patent Number: 5,788,347
[45] Date of Patent: Aug. 4, 1998

[54] INTERLOCKING SYSTEM FOR COMPUTER PERIPHERAL ENCLOSURES AND THE LIKE

[76] Inventor: Josef Rabinovitz, c/o JMR Electronics, Inc., 20400 Plummer St., Chatsworth, Calif. 91311

[21] Appl. No.: 613,260

[22] Filed: Mar. 8, 1996

[51] Int. Cl.[6] .................................................. F16B 12/10
[52] U.S. Cl. .......................... 312/111; 403/329; 403/388; 439/701; 439/717; 312/223.2
[58] Field of Search ........................... 312/223.1, 232.2, 312/107, 108, 111; 439/353, 357, 358, 701, 717; 361/683, 725, 726, 727; 403/329, 326, 388

[56] References Cited

U.S. PATENT DOCUMENTS

| | | | |
|---|---|---|---|
| 3,552,579 | 1/1971 | Simon et al. ................. | 312/111 X |
| 4,036,371 | 7/1977 | Michel . | |
| 4,105,348 | 8/1978 | Anderson et al. . | |
| 4,239,306 | 12/1980 | Klaus . | |
| 4,353,470 | 10/1982 | Polhemus et al. ................. | 312/111 X |
| 4,501,460 | 2/1985 | Sisler . | |
| 4,558,914 | 12/1985 | Prager et al. . | |
| 4,648,737 | 3/1987 | Lake, Jr. et al. . | |
| 4,684,737 | 8/1987 | Lake, Jr. et al. ................. | 312/111 X |
| 4,774,792 | 10/1988 | Ballance . | |
| 4,996,628 | 2/1991 | Harvey et al. . | |
| 5,122,077 | 6/1992 | Maejima et al. ................. | 439/398 |
| 5,156,556 | 10/1992 | Ma . | |
| 5,218,760 | 6/1993 | Colton et al. ................. | 361/683 X |
| 5,227,957 | 7/1993 | Deters ................. | 312/223.2 X |
| 5,235,493 | 8/1993 | Yu . | |
| 5,253,133 | 10/1993 | Guo . | |
| 5,288,251 | 2/1994 | Sumida ................. | 439/701 |
| 5,480,117 | 1/1996 | Fleming, III . | |
| 5,484,223 | 1/1996 | Saito ................. | 403/329 |
| 5,586,002 | 12/1996 | Notarianni ................. | 361/683 X |
| 5,604,662 | 2/1997 | Anderson et al. . | |
| 5,612,854 | 3/1997 | Wiscombe et al. ................. | 361/727 |

*Primary Examiner*—Peter R. Brown
*Assistant Examiner*—Stephen Vu
*Attorney, Agent, or Firm*—Oppenheimer Wolff & Donnelly LLP

[57] ABSTRACT

A system for interlocking various computer peripheral enclosures to prevent them from falling off of desk tops or off of each other, to compactly organize them to save space and prevent disconnection or tangling of their connecting wires, to more easily and securely move them from one location to another, and to provide an attractive interlocking arrangement. L-shaped brackets are secured to the enclosures or housings, preferably at the enclosure bases, and extending up their sides. Interlocking devices have snap-in members at each end thereof. One member snaps into an opening in a bracket of one enclosure unit and another member snaps into an opening in a bracket of another enclosure unit, thereby the two units are securely held together in a side-by-side or one-on-top-of-the-other arrangement. Insertion of a narrow tool into an opening in the bracket allows for easy unsnapping or disconnect. Optional carrying handle, cable manager, and angled foot support embodiments are also provided for releasable snap fit attachment to the brackets.

36 Claims, 15 Drawing Sheets

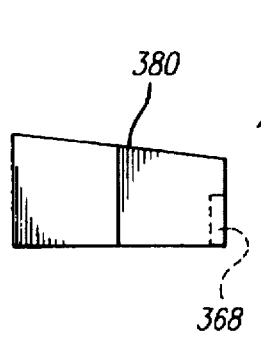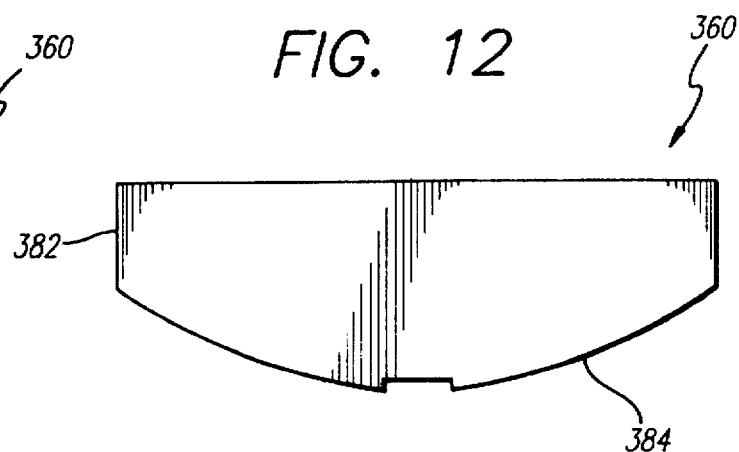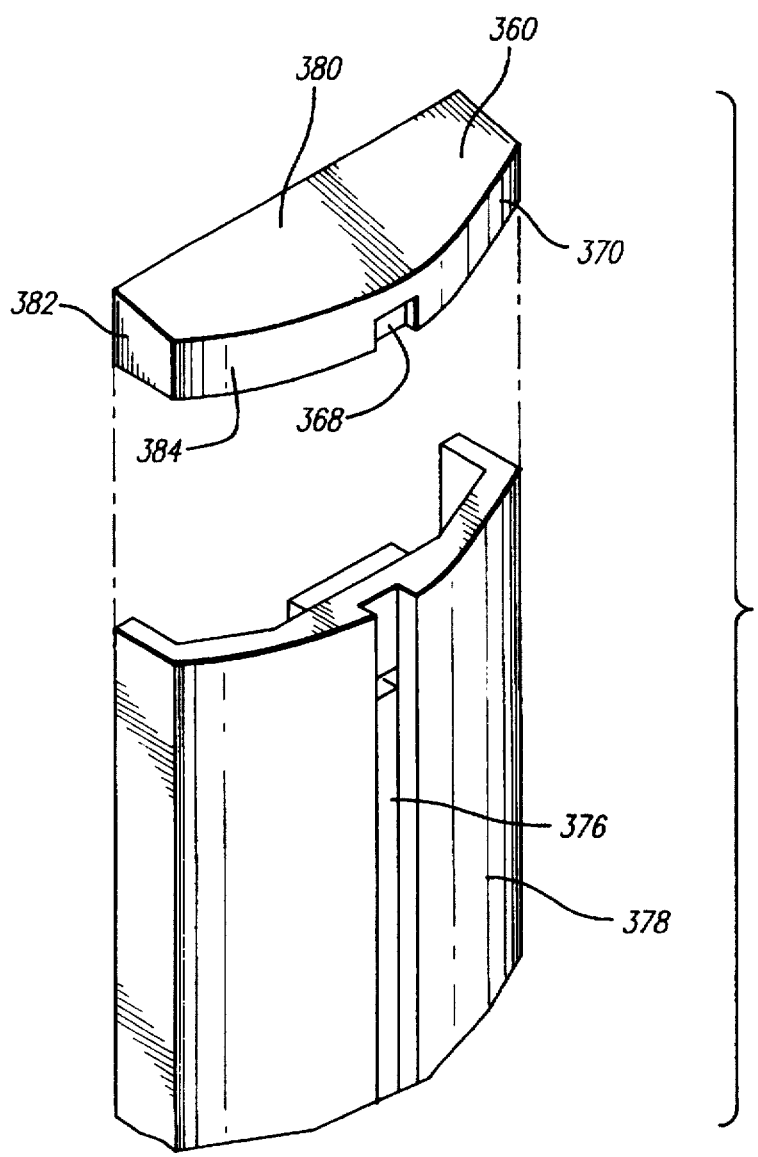

INTERLOCKING SYSTEM FOR COMPUTER PERIPHERAL ENCLOSURES AND THE LIKE

BACKGROUND OF THE INVENTION

The present invention relates primarily to systems for interlocking computer peripheral modules together in various horizontal and/or vertical stacking arrangements.

Computer systems today, both in the home and office, typically include numerous storage or other peripheral devices, such as CD ROMs, floppy disks, magnetic optical disk drives, and tape back-up systems, to be connected by wires or otherwise operated in conjunction with a computer (personal or Macintosh). It is important to organize and arrange these devices to be in efficient close proximity to one another, to minimize the horizontal as well as vertical space (the footprint) which they occupy, and to connect them together in the desired arrangement securely to prevent them from falling off of one another and/or off of desk or table tops. Unfortunately, the interlocking systems of the prior art do not provide for easy flexible use, easy unlocking and unlocking, and an attractive appearance.

SUMMARY OF THE INVENTION

Directed to remedying the problems in the prior art, an improved interlocking system, particularly adapted for interconnecting or mechanically locking together computer peripheral enclosures, is herein provided. The system includes according to one embodiment four L-shaped brackets connected to the bottom of a first enclosure or modular unit. Two of them extend with their back portions (parallel) up one side (or end) of the unit and the other two up the other side (or end). The feet of the brackets are screwed to the bottom surfaces of the units.

Four similar brackets are similarly attached to a second unit. A first interlocking device is snap fit at one end to one of the back portions of the first unit and the opposite end to one of the back portions of the second unit. A similar second interlocking device is snap fit into the corresponding back portions parallel thereto of the two units. And thereby the first and second units are securely held together in side-by-side or one on top of the other arrangements. Inserting narrow tools into openings in the brackets releases the snap fit interlock as desired, to disconnect the units.

Instead of locking two units together, the interlocking devices can be configured and connected together as a carrying handle for one of the units, as a cable handler for the unit, or as an angled base for the unit. Different external surface configurations of the back portions, the body portions of the interlocking devices, the top trim caps and the bottom foot pads allow for various attractive system designs, and also to enclose them to prevent dust or dirt from collecting therein.

Other objects and advantages of the present invention will become more apparent to those persons having ordinary skill in the art to which the present invention pertains from the foregoing description taken in conjunction with the accompanying drawings.

BRIEF DESCRIPTION OF THE DRAWINGS

FIG. 10 is an enlarged exploded perspective view showing a trim cap for the top of the bracket;

FIG. 11 is an end view of the cap of FIG. 10;

FIG. 12 is a bottom view of the cap;

FIG. 21 is a perspective view of a snap-in cable manager system of the present in on;

DETAILED DESCRIPTION OF PREFERRED EMBODIMENTS OF THE INVENTION

Figure 1:
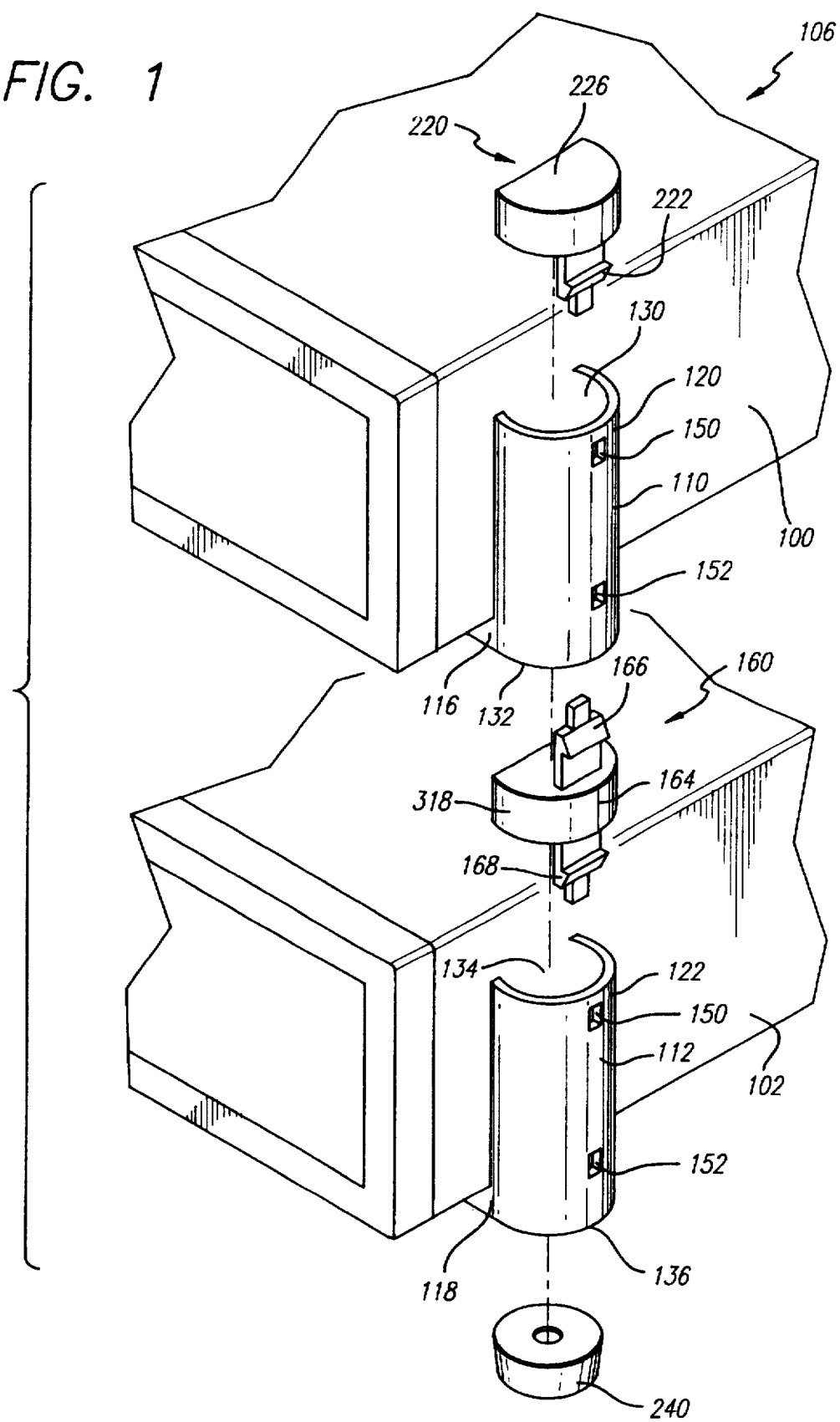
FIG. 1 is an exploded perspective view of an interconnecting system of the present invention.

Referring to the drawings, a number of embodiments of the present invention are illustrated and a basic form of the invention is shown in FIG. 1. It is seen that there are first and second units 100, 102, which can be housings or other enclosures and can include storage or other peripheral devices, such as CD ROM drives, floppy disks, magnetic optical disk drives, and tape backup systems. An interlocking system of the present invention illustrated generally at 106 interlocks or mechanically connects the two units 100, 102. The system 106 includes first and second L-shaped brackets 110, 112, each screwed (or otherwise secured) onto the bottoms of the respective units 100, 102, as will be described in detail later. Each bracket 110, 112 has a generally horizontal foot portion 116, 118 and a generally vertical back portion 120, 122; the respective portions are integrally formed together as L-shapes.

Figure 2:
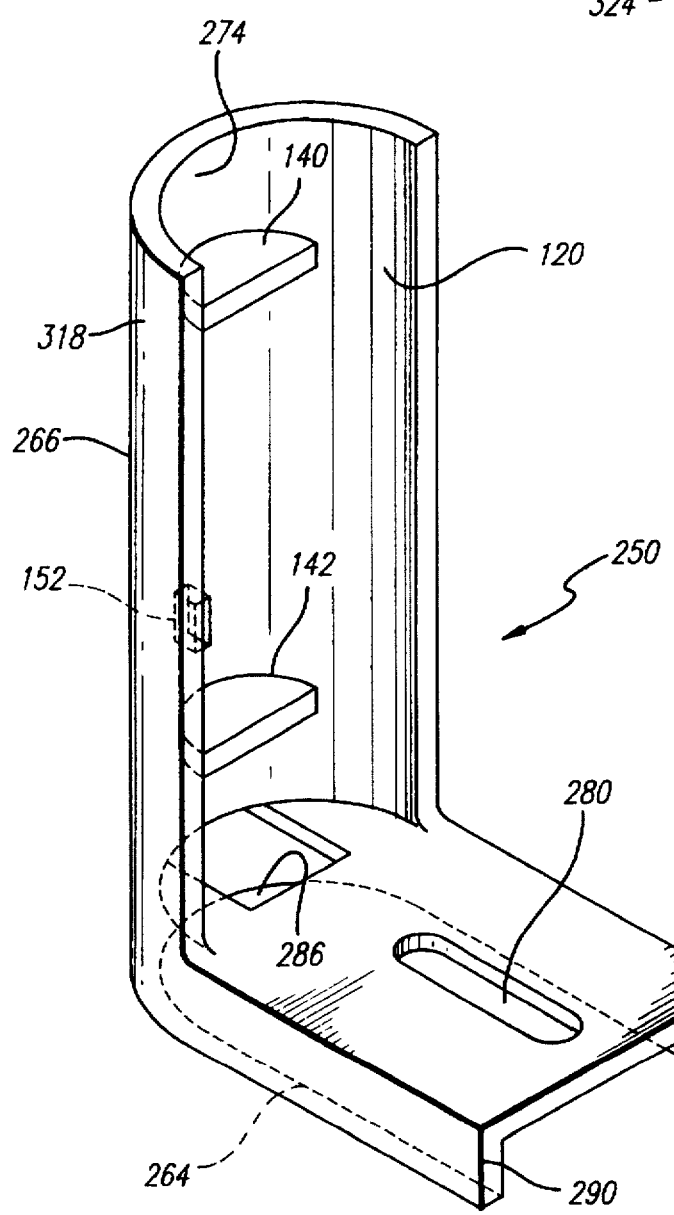
FIG. 2 is an enlarged rear perspective view of an L-shaped bracket similar to that of FIG 1, shown in isolation.
Figure 4:
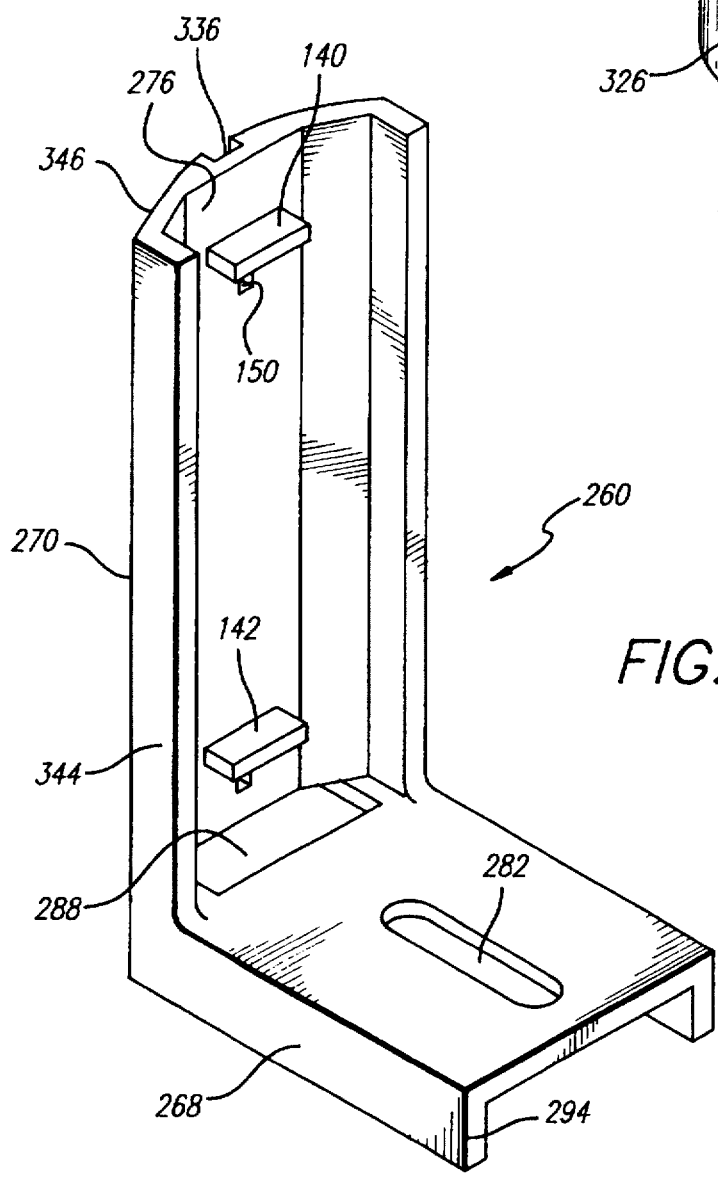
FIG. 4 is an alternative embodiment of the bracket of FIG. 2.
Figure 6:
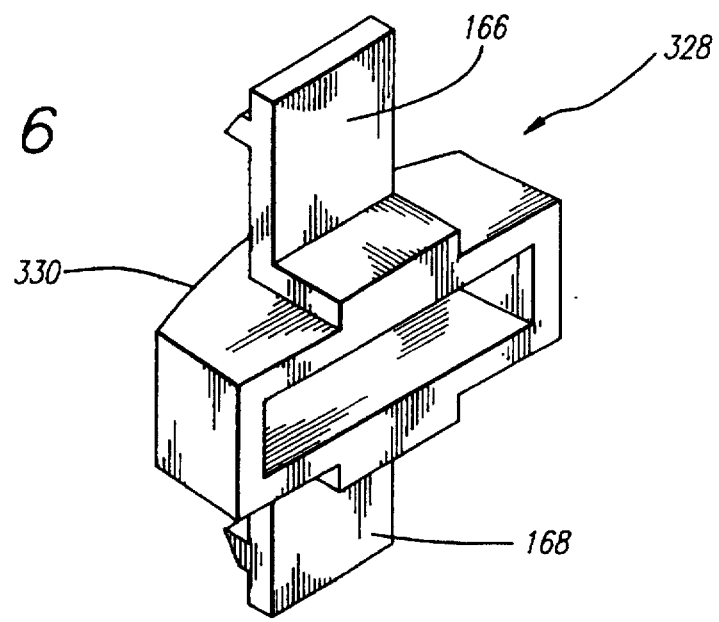
FIG. 6 is a rear perspective view of an interlocking connector, similar to that of FIG. 5.

The back portions 120, 122 have respective openings 130, 132, 134, 136 at the top and bottom ends thereof. In the interior of the back portions 120 (122) as shown in FIGS. 2 and 4, for example, are upper and lower ribs, ridges, or stop members 140, 142. And adjacent to these ridges 140, 142 on the opposite sides of the respective end openings are small front or side access through-openings 150, 152, whose purpose will become apparent with the later discussion of FIG. 8.

The system further includes an interlocking device shown generally in the center of FIG. 1 at 160. This device 160 has a body portion 164, a first hook-type lock 166 extending from the top of the body portion and a second hook-type lock 168 extending from the bottom of the body portion. The first or top hook lock 166 is snapped in through the bottom opening 132 of the first L-shaped bracket 110 such that the hook latches onto the bottom ridge (142) therein. Similarly, the second or bottom hook lock 168 fits into the top opening 134 of the back portion and snaps onto the top ridge (140) therein. Thereby, the first and second L-shaped brackets 110, 112 and thus the first and second units 100, 102 are releasably attached together. Also, as will become more apparent from subsequent drawings, the body portion 164 has a unique shape to coordinate with the outer shapes of the first and second back portions 120, 122.

A second interlocking device 180, not shown in FIG. 1, can also be provided to snap into the top opening 130 of the first bracket 110 such that a third unit (190) also not shown in FIG. 1, can be snap fit on top of the first unit 160. In other words, the units would be stacked three high. Three unit high stacking arrangements are shown, for example, in FIGS. 9 and 13–16 generally, at 200, 202, 204, 206, 208, respectively. Additional units can be stacked on top or below these units by simply providing additional interlocking devices with each of the units having their respective L-shaped devices attached thereto as would be apparent to those skilled in the art.

With the desired number of units stacked and interlocked, a trim cap 220 can be snap fit onto the top of the L-shape device 110 of the uppermost unit (e.g., 100 or 190) down into the top opening 130 of the back portion 120 thereof, as shown in FIG. 1. This trim cap 220 can have a similar hook lock 222 to hook onto the upper ridge in that L-shaped bracket 110. The trim cap 220 also can have a top hat or cap portion 226 providing a simple attractive closure for the unit.

Similarly, at the bottom of the system 106 a foot pad 240 can be inserted into the bottom opening 136 of the lowermost L-shaped bracket 112. The foot pad 240 need not (although it can) have a hook-type lock, but rather can be made of an elastic material so that it can be press fit into the bottom opening 136. In fact, it is preferable that the foot pad 240 have an elastic type construction with smooth corners so as not to mar or scratch any surfaces on which it may rest or impact.

Figure 7:
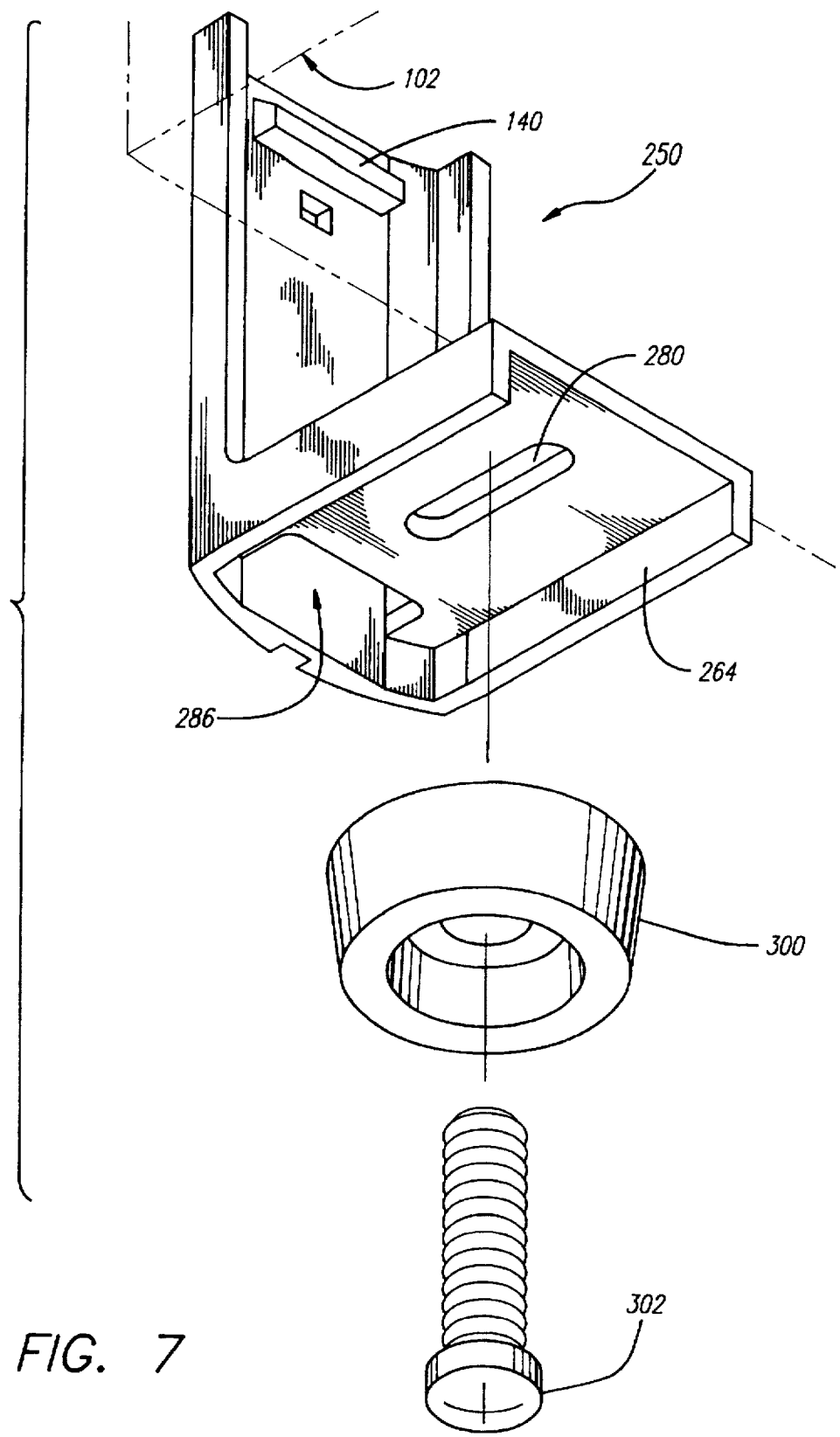
FIG. 7 is an enlarged, exploded bottom perspective view showing the attachment of a bracket (such as that of FIGS. 1, 2 or 4) to an enclosure.

FIGS. 2 and 4 shown in greater detail the constructions of variations of the L-shaped brackets 250, 260. It is seen therein that they both include the foot and back portions 264, 266, 268, 270. The back portions 266, 270 have a cylindrical or similar type shape and define top openings 274, 276, respectively. Similarly, bottom openings 286, 288 are defined at the bottom ends of the back portions 266, 270 through the respective foot portions 264, 268. The ribs or ridges 140, 142 are molded or otherwise secured to the inner surface of the back portions and the access openings 150, 152 are formed adjacent thereto. The foot portions 264, 268 have U-shapes with slots 280, 282 through the top surface such that the flange sides 290, 294 of the U-shape define a holder or region for a nut 300. This nut 300 fits into the U-shape as best shown in FIG. 7 with a screw 302 or other connector passing up through the nut through the slot 280 and into corresponding foot opening 310 as typically is already provided in these types of (computer peripheral) units.

The L-shaped brackets (e.g., 110) as well as the interlocking devices 160 can be economically molded with a durable plastic into the desired shape. The hook or snap locks 166, 168 at the ends of the connector devices 160 have a resilience to them so that when they are pushed down into the openings 130, 132, etc., at the ends of the bracket members 110, etc., they will deflect a slight distance. The hooks or ridges 140 will thereby snap over the ridges of the interior of the bracket portions snapping into place with a resilient hook snap arrangement.

Figure 8:
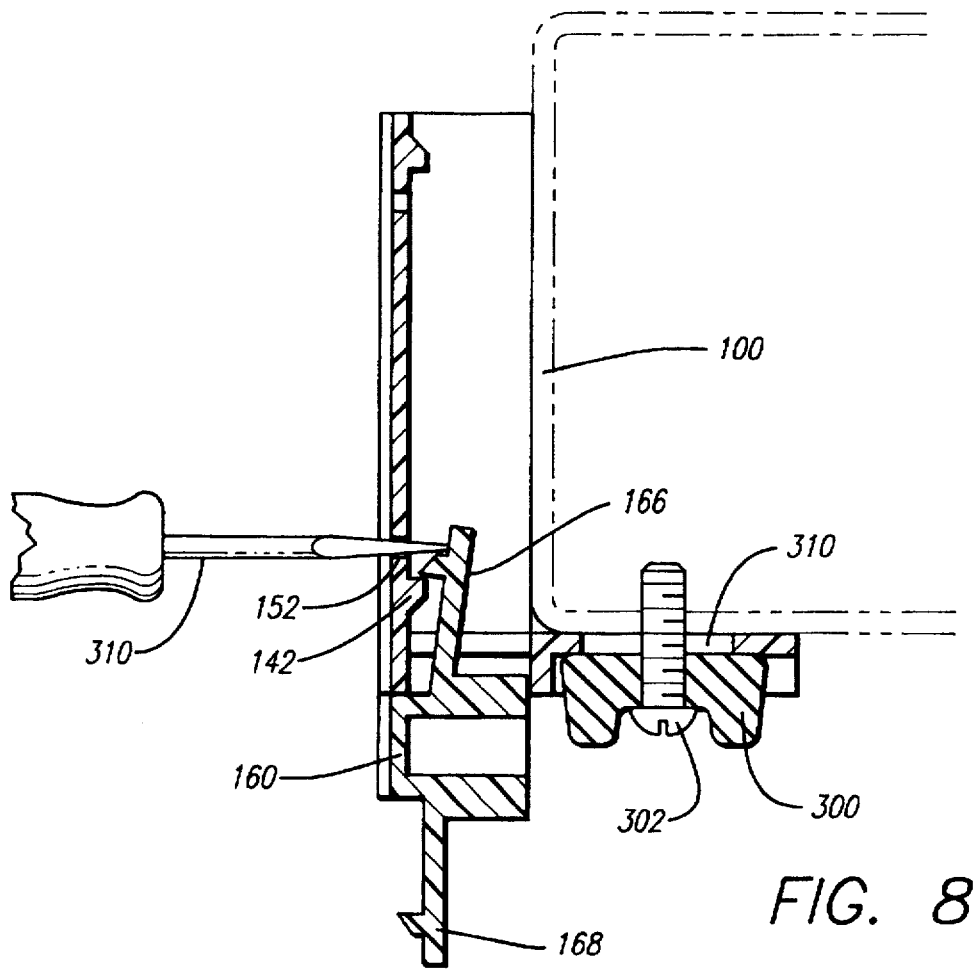
FIG. 8 is a cross-sectional view showing a procedure for releasing an interlocking connector from a bracket of the invention.

Disconnecting the connector devices 160 from the L-shaped brackets 110 is an easy process, as can be understood from FIG. 8. An elongate pointed tool, such as a screwdriver 310, is inserted into the access through-opening in the face of the bracket so that it engages the extension of the hook. And with a slight amount of pressure exerted thereagainst, the hook is pushed away from the ridge and out of engagement. The interlocking device 160 can then simply be pulled out and away of the top or bottom openings of the back portion.

Figure 3:
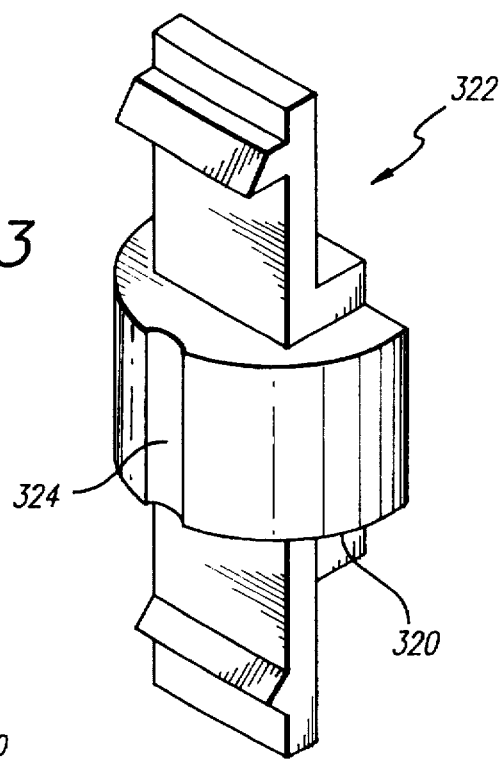
FIG. 3 is an enlarged perspective view of an interlocking connector similar to that of FIG. 1 shown in isolation.

Various configurations of the outer surface of the back portion and the outer surface of the body portion of the connector device are possible to present various alternative attractive designs. One embodiment is to have a simple smooth curve as shown in FIG. 1, for example. Another is to have a less rounded more elliptical shaped curve 318 to the back portion as shown in FIG. 2, with the body portion 320 of the connector device 322 as shown in FIG. 3 having a matching shape. The body portion can also have a decorative vertical slot 324 in the central portion thereof.

Figure 5:
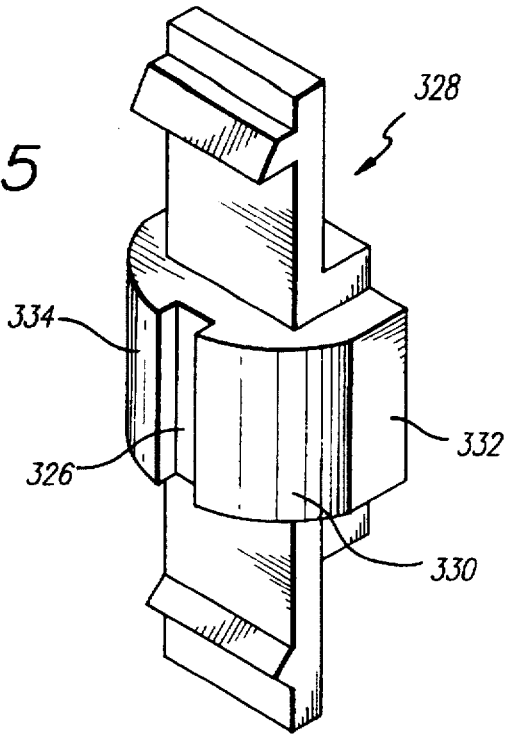
FIG. 5 is an alternative embodiment of the interlocking connector of FIG. 2.

A similar slot 326 is also shown in the device 328 of FIG. 5. Shown therein is a slightly different shape of the outer surface of the body portion 330 wherein the outer edges 332 are flat and the central portion 334 is more rounded. The corresponding back portion of the L-shaped bracket, as shown in FIG. 4, has a similar shape with a slot 336 and side straight flat surfaces 344 and the rounded middle portion 346. These vertical slots 326, 336 do not pass all the way through the back portions of the L-shape brackets or the body portion of the connector device such as to divide them in half or form a through-slit. Rather, they just penetrate or extend a slight distance to form a decorative configuration.

Figure 9:
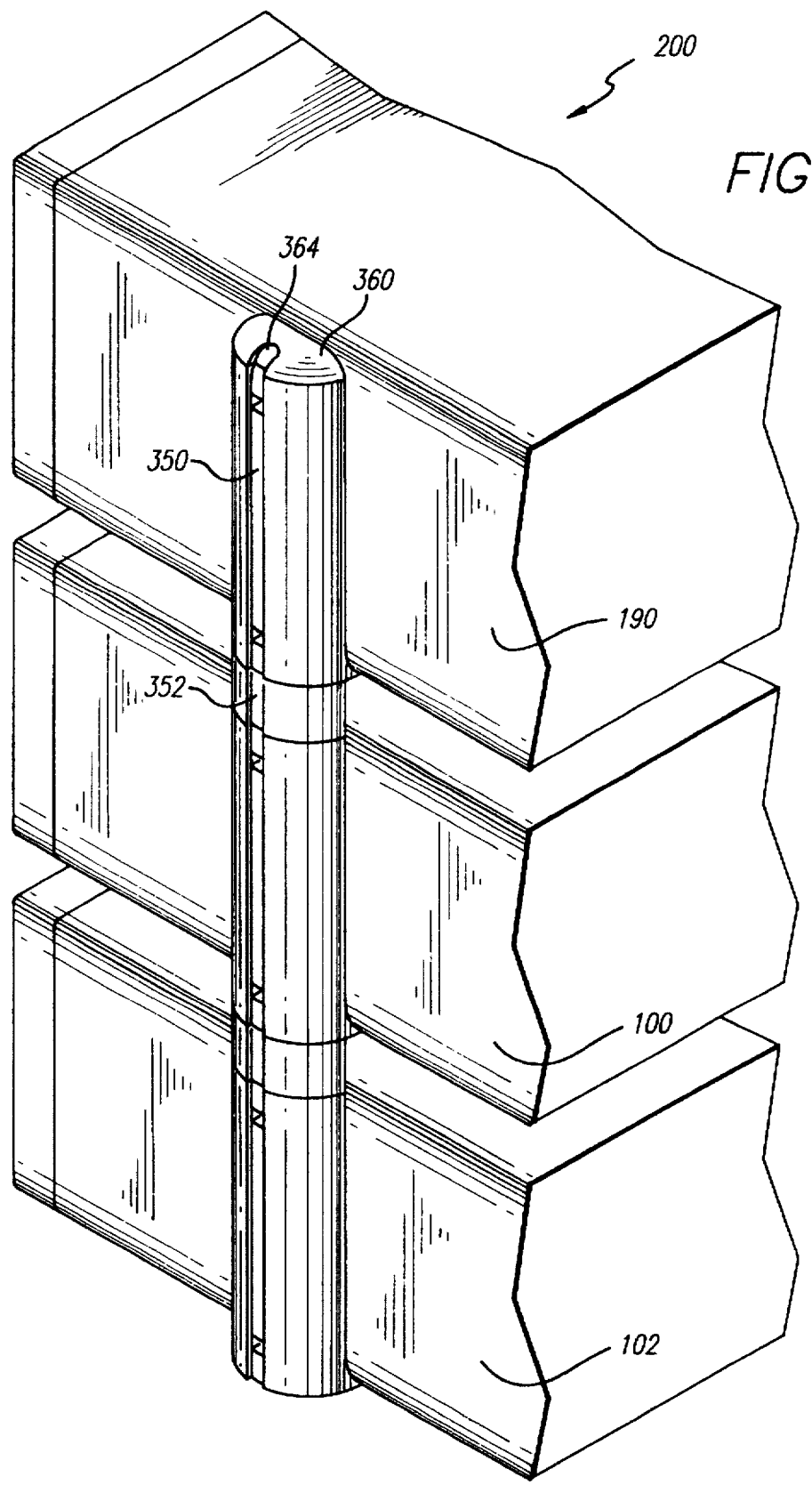
FIG. 9 is a perspective view of an alternative interconnecting system shown in use.

FIG. 9 shows at 200 a configuration where the portions of the connector device and the back portions of the L-shaped brackets are each rounded, and each have vertical slot 350, 352. And the trim cap 360 has a rounded, almost spherical shape with a small rounded slot 364 at the center thereof aligned and conjoining with the slots 350 of the adjacent back portion 378. FIGS. 10–12 show a variation thereof with the small slot 368 at the center base of the trim cap 370 aligned with the slot 376 in the adjacent back portion 378. This causes the trim cap 360 and the back portion 380 to resemble a continuous piece with the small slot portion 368 of the base of the cap 360 forming the top of the slot 376 of the back portion. This cap 360, unlike that of FIG. 9, has a generally flat and sloping top 380 and flat side edges 382 angling inward at a very slight angle as can be seen from FIG. 12, and a gentle, rounded central portion 384.

Figure 13:
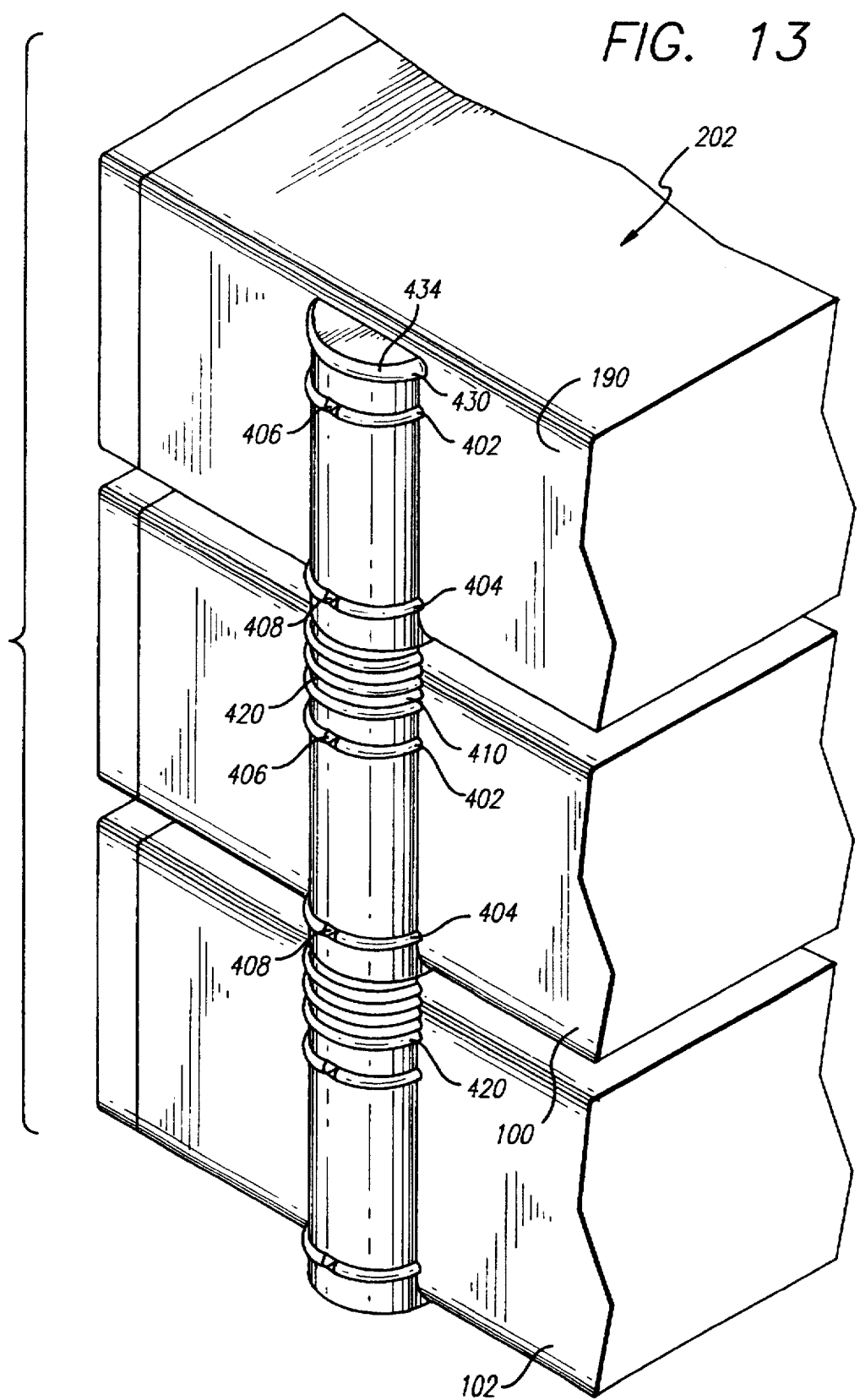
FIG. 13 is a view similar to FIG. 9 showing a further embodiment.

FIG. 13 shows at 202 a slightly more complex design with lateral ribs or protrusions 400 extending horizontally and spaced one from another. The back portion of the L-shaped bracket has two of these rounded exterior ribs 402, 404 with the access through-openings 406, 408 passing therethrough at opposite ends. It is seen that this same construction is provided for each of the three L-shaped brackets illustrated therein. The body portions of the connector devices 410 have a series of adjacent lateral ribs 420 forming a series of arcs or bumps when viewed in horizontal cross section. The trim cap 430 has a rib 434 at its top surface.

Figure 14:
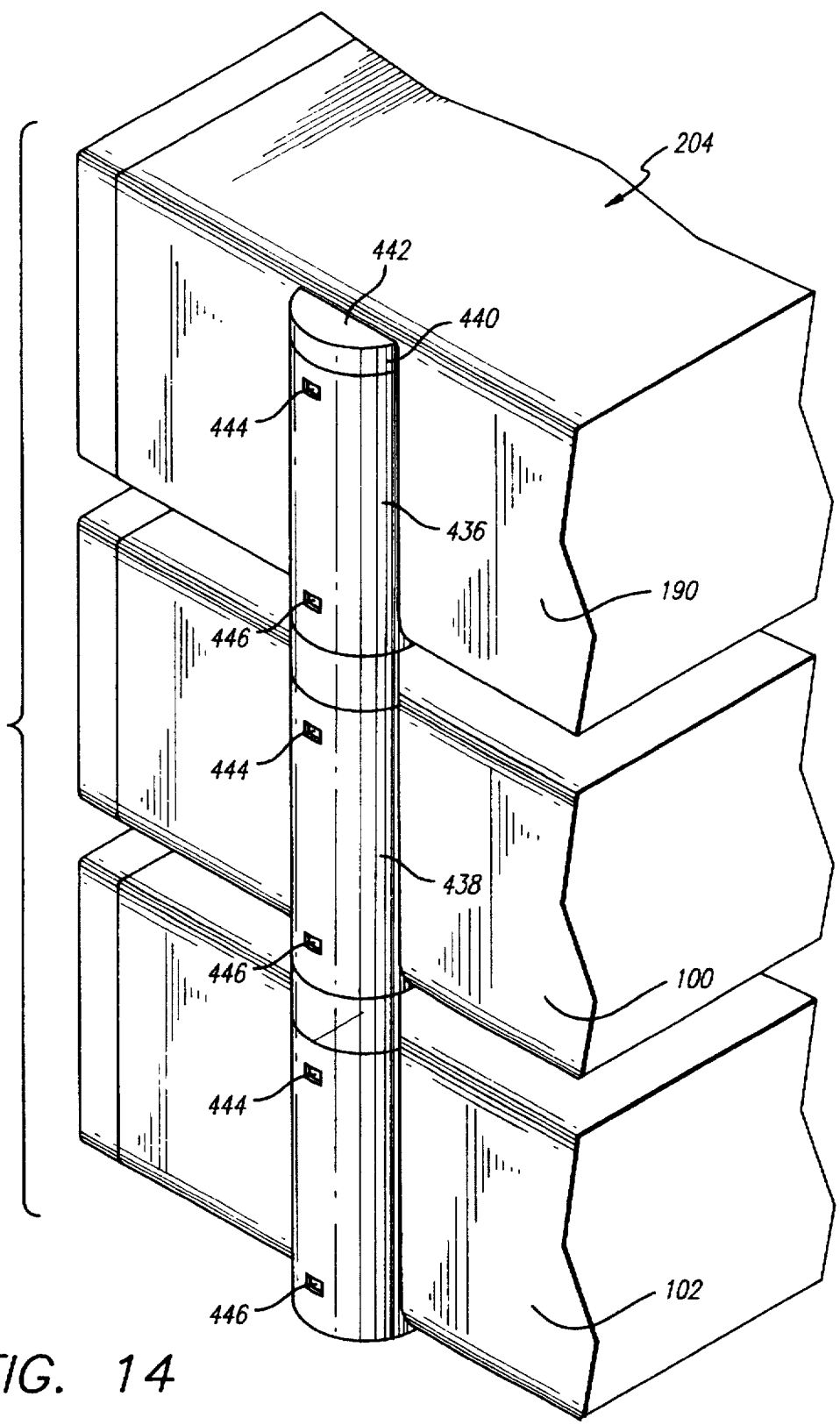
FIG. 14 shows a still further embodiment.
Figure 15:
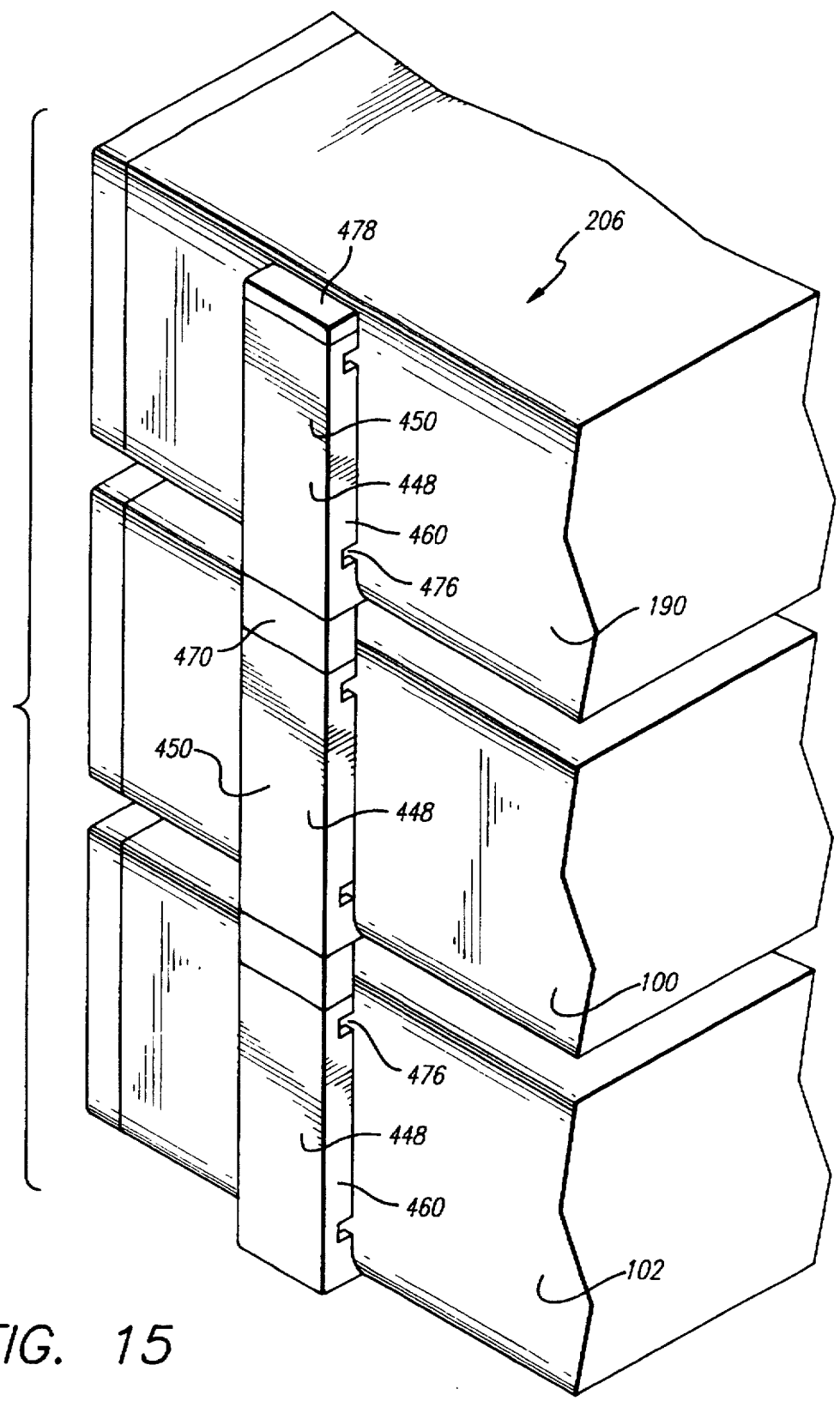
FIG. 15 shows an even still further embodiment.

FIG. 14 shows at 204 a simpler configuration with the back portions 436 and body portion being rounded with an almost semicircular shape and the trim cap 440 having the same curvature and a generally flat top 442. Suitable access through-openings 444, 446, in the back portions 436. In contrast, FIG. 15 shows at 206 a rectangular or box like configuration with the back portions 448 having a wide outward face 450 and a narrow (side) thickness 460 away from the units. The body portions of the connector devices 470 have a similar wide and narrow angled configuration. The disconnect openings 476 instead of being provided on the front face are provided on the side edges. The trim cap 478 can have a slightly less angular, more rounded configuration than the brackets as shown in FIG. 15.

Figure 16:
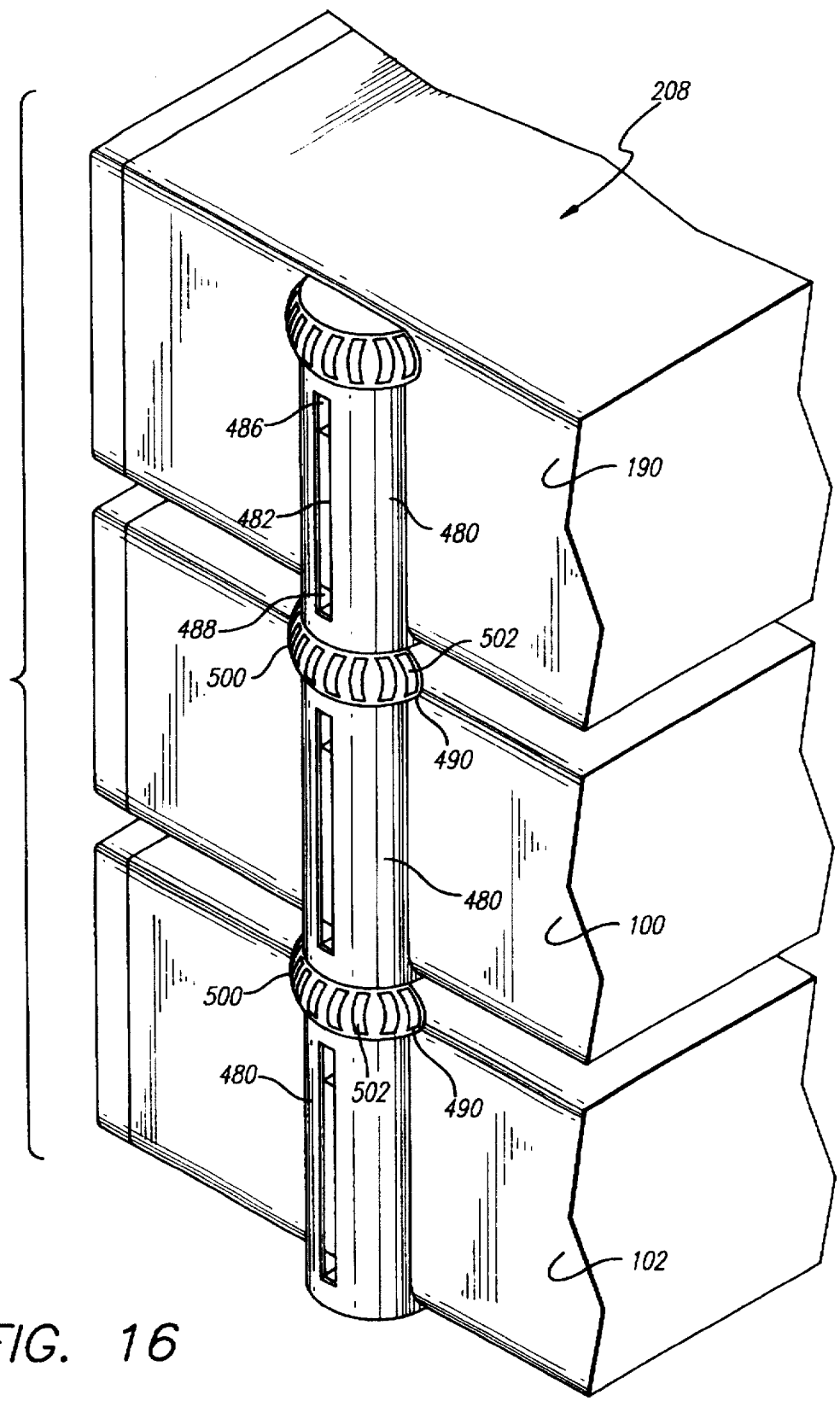
FIG. 16 shows another alternative embodiment.

FIG. 16 shows at 208 an interesting design of this invention with the back portions 480 being semicircular and having a vertical slot 482. However, the slot 482 does not extend the full height but rather ends with the access through-openings 486, 488 at both ends thereof. The body portion of the connector devices 490 is configured so that it has a bulge portion 500, which bulges out slightly away from the plane of the back portions. It also has vertical arcuate slots or depressions 502 spaced about its circumference. These slots 502 also do not extend the full height of the body portions, similar to the slots of the brackets not extending the full height thereof. The trim cap 510 also has a bulging portion 512 with slots 514 and flat top 516.

Figure 17:
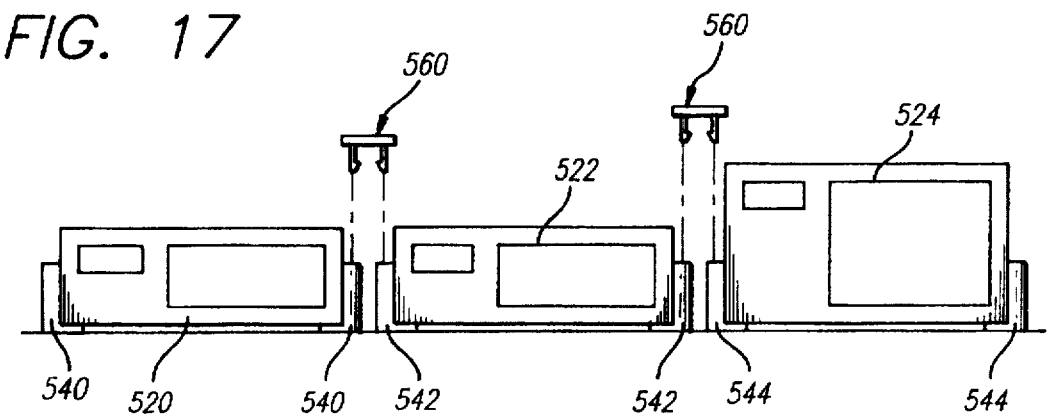
FIG. 17 is a partially exploded side elevational view of an alternative side-by-side interconnecting system of the present invention.
Figure 18:
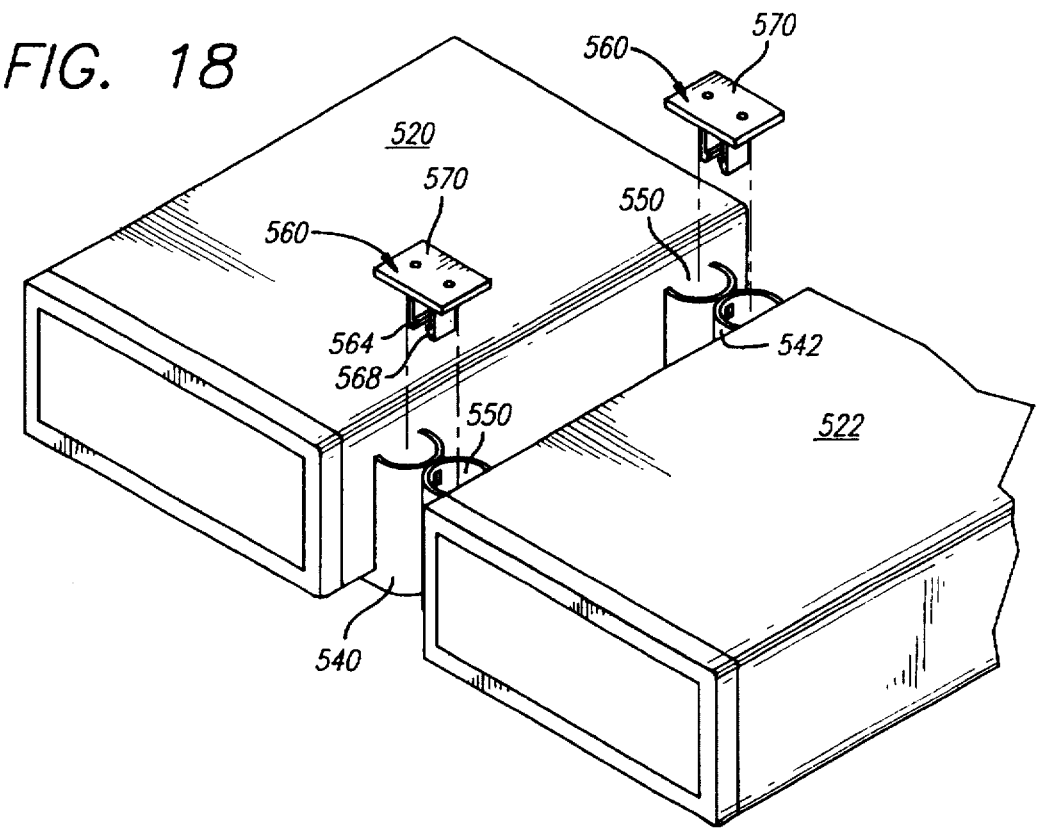
FIG. 18 is a top perspective view of a portion of the system of FIG. 17.
Figure 19:
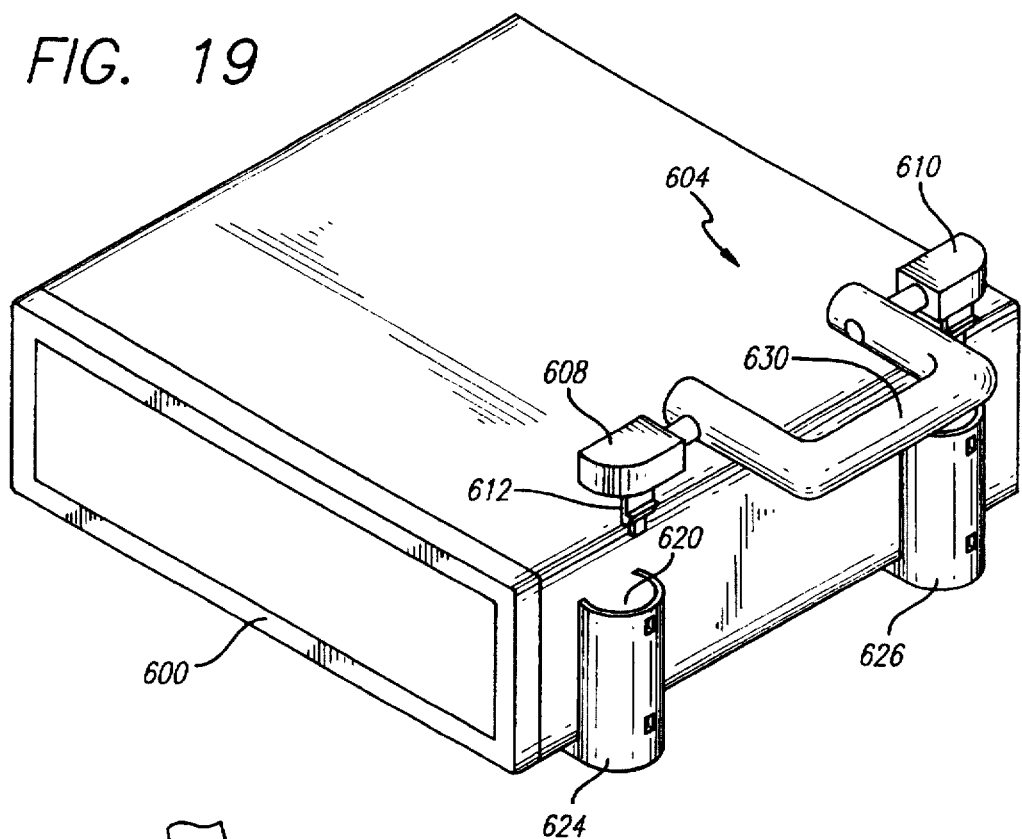
FIG. 19 is a partially exploded perspective view of a handle system of the present invention.

The connector devices (e.g., 160) described above each have a body member with the locking resilient hook type locks extending linearly out opposite ends thereof so as to connect together two units (housings, computer peripheral device enclosures, etc.), stacked one on top of the other. However, it is also within the scope of the invention to interlock units 520, 522, 524 in a side-by-side relation, as best shown in FIGS. 17 and 18. It is seen therein that similar L-shaped brackets 540, 542, 544 are attached to each of the units. Similar to the one-on-top-of-the-other arrangement (as shown in FIG. 1, for example), four brackets are preferably used for each unit, two each spaced on opposing sides. The back portions of the L-shaped brackets similarly each have top (and bottom) opening(s) 550 and associated locking ridges inside on the front interior surface. The interlocking devices 560 have a similar type of hook-type arrangement with two hooks 564, 568 protruding out from a body 570. The hooks 564, 568, however, extend parallel to one another (and not in an opposite linear fashion like in the previous interlocking device); that is, they form an inverted U-type shape when viewed from the side. They extend parallel to one another with the hooks 564, 568 themselves facing one another and from the same side of the body member 570. The body member 570 can be shaped simply like a thick plate. To release the snapped-in hook locks (which have the same type of resilient snap locking function as the previously described embodiment), openings are provided in the back portions of the brackets 540, 542. The access openings can be provided in the sides as opposed to the front of the back portion to make them a little more accessible with the L-shaped brackets of opposing units 520, 522 (or 522, 524) in a close back-to-back interlocked relationship as shown in FIGS. 17 and 18.

Figure 20:
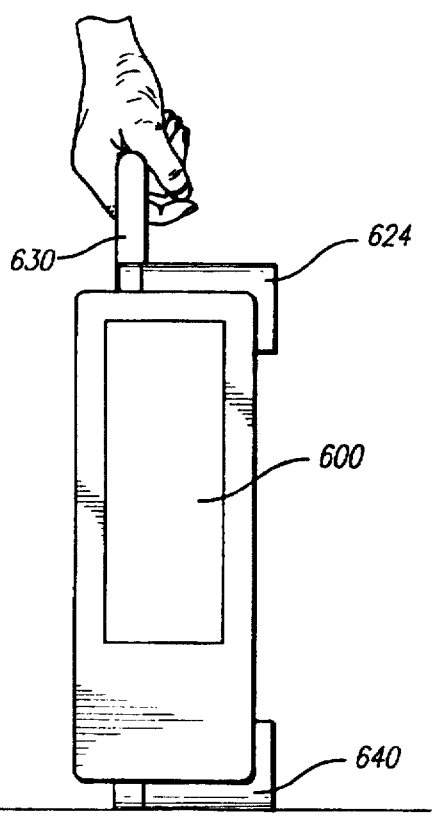
FIG. 20 is reduced view of the system of FIG. 19 shown in use.

Another embodiment of the present invention uses the same type of four L-shaped brackets secured to the unit. However, instead of interlocking that unit 600 together with another unit, a handle assembly as shown generally at 604 is provided. At opposite ends of the assembly 604 are body members 608, 610 each with a respective laterally protruding hook 612. These hooks 612 are shaped similar to the previously-described hooks and function the same way to resiliently snap down into the top openings 620 of the back portions 624, 626 and lock therein onto the internal ridges. Between a pair of these body portion and hook members, the handle portion 630 is interconnected with a swivel relationship. Thus, with the body portions snapped into place and to the L-shaped brackets 624, 626 on the same side of the unit 600 a secure interlock is provided. And the unit can be lifted by grasping the handle 630 as shown in FIG. 20. FIG. 20 also shows that the opposite L-shaped brackets 640 of the unit conveniently form support feet for the unit 600, protecting it from impact and scratching and other damage, and also providing for a stable support for the unit.

Figure 21:
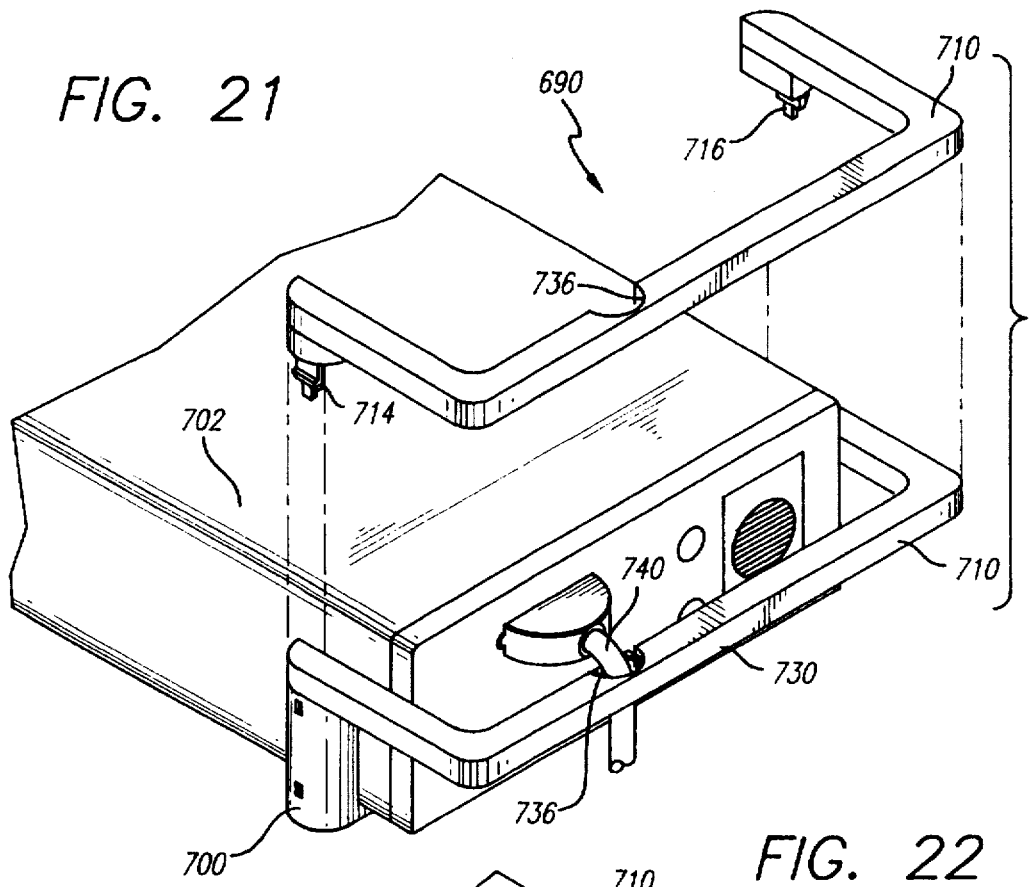
Figure 22:
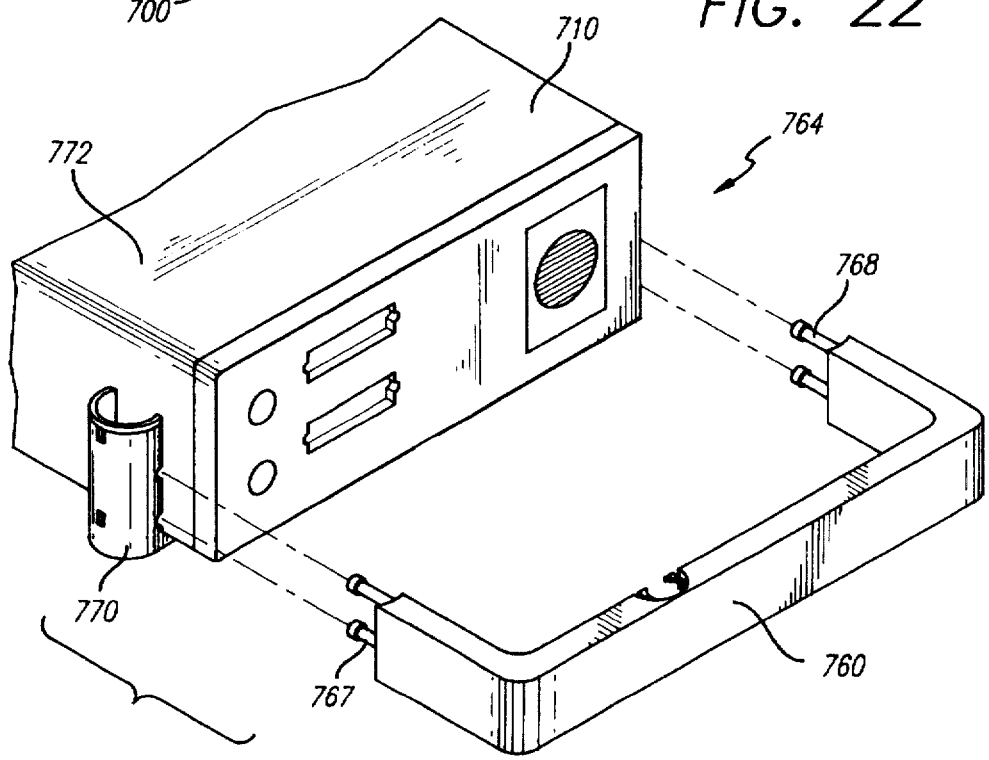
FIG. 22 is a perspective view of an alternative snap-in cable manager system.

FIG. 21 illustrates another embodiment generally at 690 of the invention which similarly has the four L-shaped brackets 700 attached to the unit 702. In this embodiment, however, a U-shaped cable manager unit shown generally at 710 is provided having connectors 714, 716 at opposite ends thereof. The embodiment 690 of FIG. 21 shows downwardly-disposed snap-type connectors 714, 716 which snap down into the top openings in the back portions 700 of the brackets, with a releasable resilient snap-in function similar to that previously described for the interconnector device and other embodiments. The central portion 730 of the U-shaped unit 710 has a recess, a snap-in clip or the like 736 to hold and retain the cable or gathered cables 740 of the unit 702, which as previously mentioned can be a computer peripheral unit. In contrast, the cable manager unit 760 of the embodiment 764 of FIG. 22 snaps with plugs 766, 768 into side (as opposed to top) openings 770 of the back portion 772. An advantage of this design is that another unit can be stacked onto this unit and snapped down into the top openings with interlocking devices of the L-shaped brackets 806, 810. This can be in an arrangement like that of the system in FIG. 1. Unlike the handle 604 which uses brackets on the same side of the unit, the cable manager units 710 and 760 use brackets on opposite sides of the unit.

Figure 23:
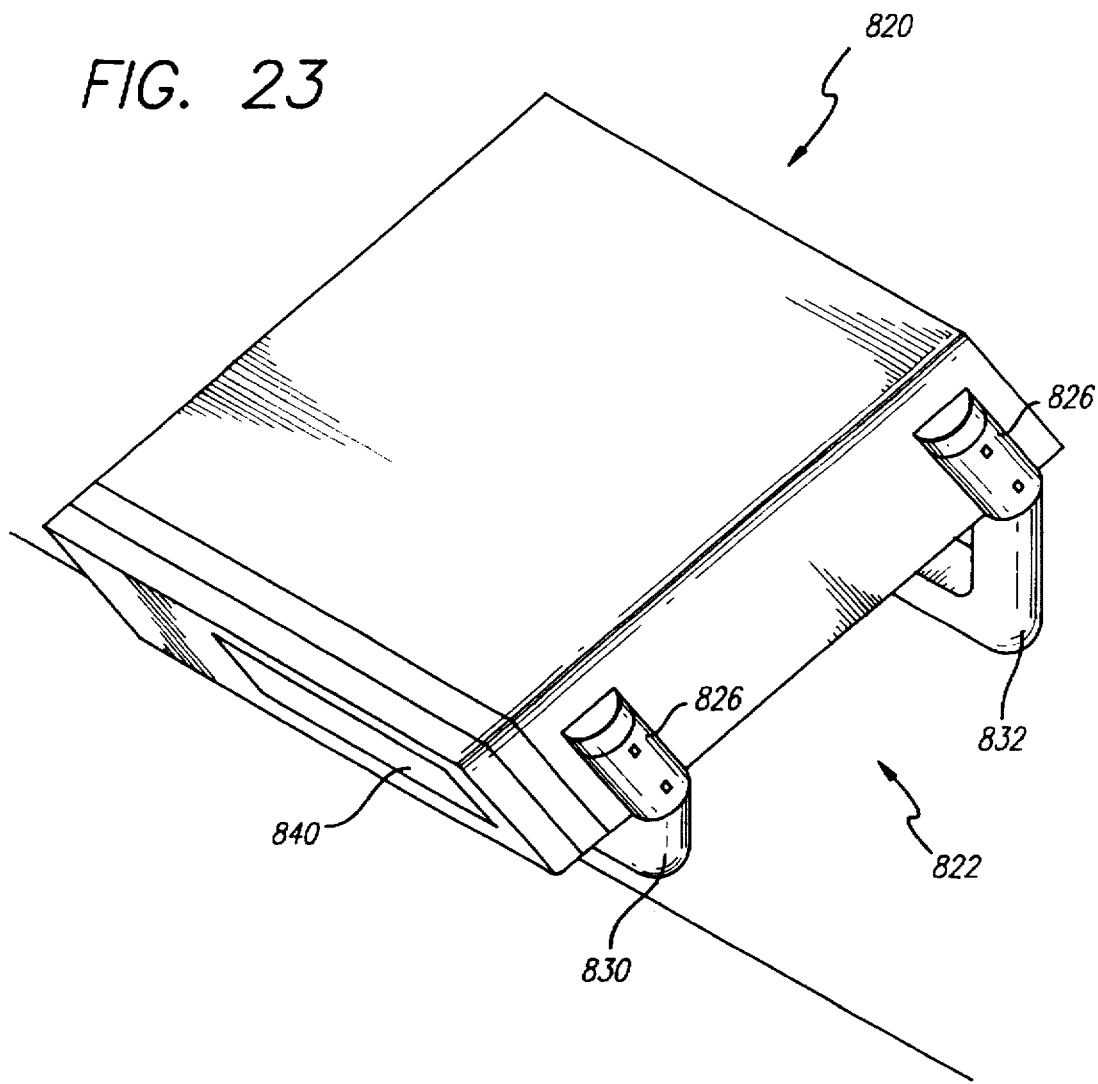
FIG. 23 is a perspective view of a snap-in angled support system of the present invention.

Another use of these L-shaped brackets and snap-in connectors is illustrated in FIG. 23 generally at 820. Shown therein is a support or leg system 822 which snaps into the bottom openings of the L-shaped brackets 826, 828. Since the legs 830, 832 are of different sizes (heights) or angles, the unit 840 then slopes at a desired angle, to the front (or back) and/or side as desired for different uses.

From the foregoing detailed description, it will be evident that there are a number of changes, adaptations and modifications of the present invention which come within the province of those skilled in the art. However, it is intended that all such variations not departing from the spirit of the invention be considered as within the scope thereof as limited solely by the claims appended hereto.

What is claimed is:

1. An interlocking system, comprising:
    a first unit;
    a first L-shaped device having generally perpendicular first back and foot portions, said first device being attachable to said first unit with said first foot portion substantially along a bottom of said first unit and said first back portion substantially along a side or end of said first unit, said first back portion having a first opening;
    a second unit;
    a second L-shaped device having generally perpendicular second back and foot portions, said second device being attachable to said second unit with said second foot portion substantially along a bottom of the second unit and said second back portion substantially along a side or end of said second unit, said second portion having a second opening; and an interlocking device having a body portion, first locking means for insertion into said first opening and snap-fit locking said body portion to said first back portion, and second locking means for insertion into said second opening and snap-fit locking said body portion to said second back portion.

2. The system of claim 1 wherein said body portion and said first and second locking means are formed as a single integral interlocking unit.

3. The system of claim 1 wherein said interlocking device is adapted to lock said first and second units together in a one-on-top-of-the-other arrangement.

4. The system of claim 1 wherein said interlocking device is adapted to lock said first and second units together in a side-by-side arrangement.

5. The system of claim 1 wherein said first opening is at a top end of said first back portion, and said second opening is at a bottom end of said second back portion.

6. The system of claim 1 wherein said first opening is at a top end of said first back portion, and said second opening is at a top end of said second back portion.

7. The system of claim 1 wherein said first and second locking means define a U-shaped arrangement with said body portion.

8. The system of claim 1 wherein said first and second locking means extend out linearly from and at opposite ends of said body portion.

9. The system of claim 1 wherein said first back portion includes an interior first locking member on which said first locking means after being inserted into said first opening can lock.

10. The system of claim 9 wherein said first locking member comprises a horizontal ridge.

11. The system of claim 1 wherein said first back portion has a cylindrical outer surface shape.

12. The system of claim 1 wherein said first opening comprises a top opening, said first back portion includes an opposite bottom opening, and said first locking means is alternatively operatively insertable into said bottom opening and locked therein.

13. The system of claim 12 wherein said first back portion includes an interior first locking member operatively associated with said top opening and an interior second locking member operatively associated with said bottom opening.

14. The system of claim 12 further comprising a trim cap insertable into said top opening to generally close said top opening.

15. The system of claim 12 further comprising a foot pad insertable into said bottom opening.

16. The system of claim 1 further comprising a lifting handle for said first unit attachable to said first back portion.

17. The system of claim 1 further comprising a cable manager unit attachable to said first back portion and having a guide for a cable of said first unit.

18. The system of claim 17 wherein said cable manager unit snap mounts into a top opening of said first back portion.

19. The system of claim 17 wherein said cable manager unit snap mounts into a side opening of said first back portion.

20. The system of claim 19 wherein said first opening is at a top or bottom end of said first back portion.

21. The system of claim 1 wherein said first unit is a computer peripheral unit housing and said second unit is a different computer peripheral unit housing.

22. The system of claim 1 further comprising a third L-shaped device attachable to said first unit on the same side or end as said first device and spaced therefrom and fourth and fifth L-shaped devices attachable to said first unit spaced from each other on the opposite side or end as that of said first and third devices.

23. The system of claim 1 further comprising releasable means for releasably attaching said first device to said first unit.

24. The system of claim 23 wherein said releasable means comprises an elongate member.

25. The system of claim 23 wherein said releasable means comprises a screw.

26. The system of claim 23 wherein said releasable means passes through an opening in said first device into an opening in said first unit.

27. The system of claim 23 wherein said first device opening is in said first foot portion.

28. The system of claim 1 wherein said side or end of said first unit comprises an upright side or end thereof.

29. The system of claim 28 wherein said side or end of said second unit comprises an upright side or end thereof.

30. The system of claim 1 wherein said first back portion is longer than said first foot portion.

31. The system of claim 1 wherein when said first device is attached to said first unit, said first back portion is substantially upright.

32. The system of claim 1 wherein said first device is detachable from said first unit.

33. The system of claim 1 wherein said first device and said first unit are formed as separate pieces.

34. An interlocking system, comprising:

a first L-shaped device having generally perpendicular first back and foot portions, said first device being adapted to attach to a first unit with said first foot portion substantially along a bottom of the first unit and said first back portion substantially along a side or end of the first unit, said first back portion having a first opening;

a second L-shaped device having generally perpendicular second back and foot portions, said second device being adapted to attach to a second unit with said second foot-portion substantially along a bottom of the second unit and said second back portion substantially along a side or end of the second unit, said second portion having a second opening; and an interlocking device having a body portion, first locking means for insertion into said first opening and snap-fit locking said body portion to said first back portion, and second locking means for insertion into said second opening and snap-fit locking said body portion to said second back portion;

wherein said first back portion has a cylindrical outer surface shape.

35. An interlocking system, comprising:

a first L-shaped device having generally perpendicular first back and foot portions, said first device being adapted to attach to a first unit with said first foot portion substantially along a bottom of the first unit and said first back portion substantially along a side or end of the first unit, said first back portion having a first opening;

a second L-shaped device having generally perpendicular second back and foot portions, said second device being adapted to attach to a second unit with said second foot portion substantially along a bottom of the second unit and said second back portion substantially along a side or end of the second unit, said second portion having a second opening;

an interlocking device having a body portion, first locking means for insertion into said first opening and snapfit locking said body portion to said first back portion, and second locking means for insertion into said second opening and snap-fit locking said body portion to said second back portion;

wherein said first opening comprises a top opening, said first back portion includes an opposite bottom opening, and said first locking means is alternatively operatively insertable into said bottom opening and locked therein; and a trim cap insertable into said top opening to generally close said top opening.

36. An interlocking system, comprising:

a first L-shaped device having generally perpendicular first back and toot portions, said first device being adapted to attach to a first unit with said first foot portion substantially along a bottom of the first unit and said first back portion substantially along a side or end of the first unit, said first back portion having a first opening;

a second L-shaped device having generally perpendicular second back and foot portions, said second device being adapted to attach to a second unit with said second foot portion substantially along a bottom of the second unit and said second back portion substantially along a side or end of the second unit, said second portion having a second opening;

an interlocking device having a body portion, first locking means for insertion into said first opening and snapfit locking said body portion to said first back portion, and second locking means for insertion into said second opening and snap-fit locking said body portion to said second back portion;

wherein said first opening comprises a top opening, said first back portion includes an opposite bottom opening, and said first locking means is alternatively operatively insertable into said bottom opening and locked therein; and a foot pad insertable into said bottom opening.

* * * * *